United States Patent
Kyung

(10) Patent No.: US 6,667,916 B2
(45) Date of Patent: Dec. 23, 2003

(54) MODE CONTROL CIRCUIT FOR SEMICONDUCTOR DEVICE AND SEMICONDUCTOR MEMORY DEVICE HAVING THE MODE CONTROL CIRCUIT

(75) Inventor: Kye-hyun Kyung, Suwon (KR)

(73) Assignee: Samsung Electronics Co., Ltd. (KR)

(*) Notice: Subject to any disclaimer, the term of this patent is extended or adjusted under 35 U.S.C. 154(b) by 24 days.

(21) Appl. No.: 10/073,525

(22) Filed: Feb. 11, 2002

(65) Prior Publication Data

US 2002/0186603 A1 Dec. 12, 2002

(30) Foreign Application Priority Data

May 8, 2001 (KR) .......................... 2001-24886

(51) Int. Cl.[7] .............................................. G11C 29/00
(52) U.S. Cl. ..................................... 365/201; 365/225.7
(58) Field of Search ............................... 365/201, 225.7

(56) References Cited

U.S. PATENT DOCUMENTS 4,841,133 A * 6/1989 Gercekci et al. ............ 235/492
5,617,366 A * 4/1997 Yoo ............................. 365/201

* cited by examiner

Primary Examiner—Richard Elms
Assistant Examiner—Jung H. Hur
(74) Attorney, Agent, or Firm—Mills & Onello, LLP

(57) ABSTRACT

A semiconductor memory device having a mode control circuit includes a mode entrance portion for outputting an output signal in response to an external control signal, a mode entrance control portion for generating a mode entrance enable signal, MDEN, for controlling entry by the semiconductor device into a specific mode, for example a test mode, and a logic portion for combining the two to generate a mode signal for setting the specific mode. The mode entrance control portion includes a first and second fusing portion each including a fuse and a power-up signal for activating the MDEN in a case where the first and second fuses are maintained at an initial state or are changed at the initial state, and deactivating the MDEN otherwise. The mode control circuit prevents improper entry into the specific mode.

14 Claims, 3 Drawing Sheets

180

MODE CONTROL CIRCUIT FOR SEMICONDUCTOR DEVICE AND SEMICONDUCTOR MEMORY DEVICE HAVING THE MODE CONTROL CIRCUIT

BACKGROUND OF THE INVENTION

1. Field of the Invention

The present invention relates to a semiconductor device, and more particularly, to a mode control circuit for controlling a specific mode of a semiconductor device and to a semiconductor memory device having the mode control circuit.

2. Description of the Related Art

Upon completion of the manufacture of a semiconductor device, a testing process is commonly performed for determining whether the semiconductor device operates normally. Those semiconductor devices that are determined to function normally are sold to users and those that are determined to be defective are discarded. However, it is impossible to test for the possibility of defects in all functions of the semiconductor device in the testing process. Thus, a separate test mode for more effectively testing the semiconductor device is included in the testing process.

Operations or functions that are different from normal operations stipulated in the specification of the semiconductor device can be included in the test mode. In a case where the user enters the test mode for any reason during use of the semiconductor device, errors occur in the system in which the semiconductor device is mounted. Thus, semiconductor devices are commonly designed to protect the test mode to prevent or deter entry into the test mode. Nevertheless, if the user unexpectedly enters the test mode while using the semiconductor device, errors can occur in the system employing the semiconductor device.

SUMMARY OF THE INVENTION

To address the above problems, it is a first object of the present invention to provide a mode control circuit for a semiconductor device which is capable of preventing the semiconductor device from entering a specific mode and in which a producer (or worker) can allow the semiconductor device to enter the specific mode if necessary, even by an end user of the semiconductor device.

It is a second object of the present invention to provide a semiconductor memory device having the mode control circuit.

Accordingly, to achieve the first object, there is provided a mode control circuit for a semiconductor device. The mode control circuit includes a mode entrance portion for outputting an output signal in response to an external control signal, a mode entrance control portion for generating a mode entrance enable signal for controlling the entry by the semiconductor device into a specific mode of operation, and a logic portion for logically combining the output signal of the mode entrance portion and the mode entrance enable signal to generate a mode signal for setting the specific mode. The mode entrance control portion includes a first fusing portion including a first fuse, a second fusing portion including a second fuse, and a mode entrance control signal generating portion for activating the mode entrance enable signal in a first case where the first and second fuses are maintained at an initial state or are changed from the initial state, and deactivating the mode entrance enable signal in a second case where only one of the first and second fuses is changed from the initial state.

It is preferable that the initial state of the first and second fuses is a state where at least one of the first and second fuses are closed, and the state where the first and second fuses are changed at the initial state is a state where at least one of the first and second fuses are open.

It is also preferable that the first and second fuses can be changed from the initial state following packaging.

It is also preferable that the specific mode is a test mode for testing the electrical functions of the semiconductor device.

It is also preferable that the first and second fusing portions are operated in response to a power-up signal which is increased to a predetermined voltage and is decreased to a null voltage, respectively, when supply voltage is applied to the semiconductor device.

In order to achieve the second object, there is provided a semiconductor memory device. The semiconductor memory device includes first and second pads for inputting an external control signal and data, a mode control circuit for outputting a mode signal for deciding a specific mode of operation of the semiconductor memory device in response to the control signal input through the first pad, and an internal circuit for processing data input through the second pad according to the mode signal. The mode control circuit includes a mode entrance portion for outputting an output signal in response to the control signal, a mode entrance control portion for having a first fusing portion including a first fuse, a second fusing portion including a second fuse, and a mode entrance control signal generating portion for activating a mode entrance enable signal in a first case where the first and second fuses are maintained at an initial state or are changed from the initial state, and deactivating the mode entrance enable signal in a second case where only one of the first and second fuses is changed from the initial state, to generate the mode entrance enable signal for controlling the semiconductor device to enter the specific mode, and a logic portion for logically combining the output signal of the mode entrance portion and the mode entrance enable signal to generate a mode signal for setting the specific mode.

It is preferable that the specific mode is a test mode for testing electrical functions of the semiconductor device.

It is also preferable that the internal circuit operates in the specific mode when the mode signal is activated and operates normally when the mode signal is deactivated.

According to the present invention, a user is prevented from entering a specific mode, for example during end use of the semiconductor device, and the semiconductor device can later regain entry into the specific mode, for example by a manufacturer by a producer, if desired.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
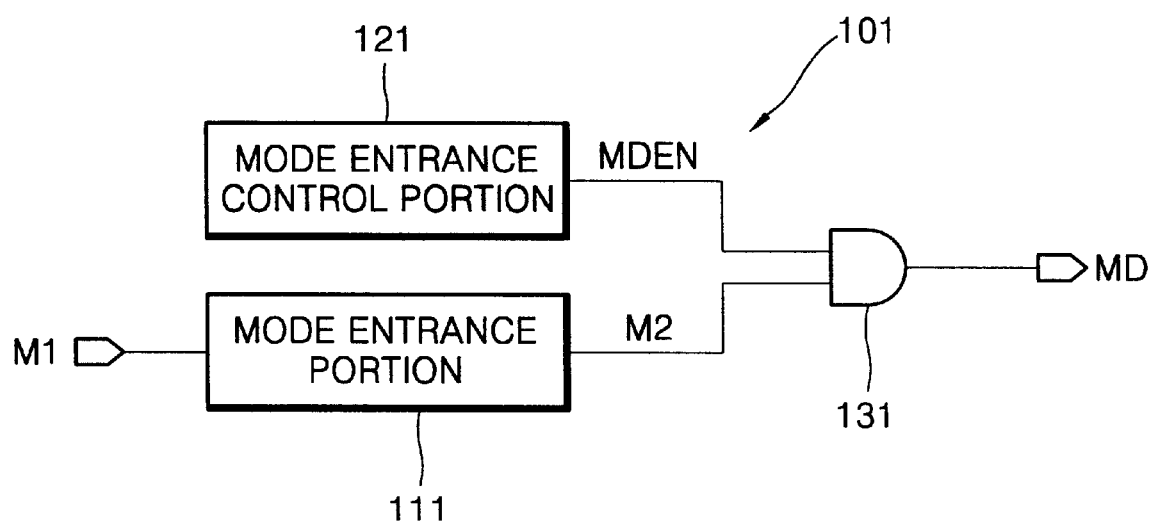
FIG. 1 is a block diagram of a mode control circuit for a semiconductor device according to the present invention.

The present invention will be described more fully hereinafter with reference to the accompanying drawings in which preferred embodiments of the invention are shown.

Hereinafter, the present invention will be described in detail by describing preferred embodiments of the invention with reference to the accompanying drawings. Like reference numerals refer to like elements throughout the drawings.

FIG. 1 is a block diagram of a mode control circuit for a semiconductor device according to the present invention. Referring to FIG. 1, a mode control circuit 101 is included in the semiconductor device and includes a mode entrance portion 111, a mode entrance control portion 121, and a logic portion 131.

The mode entrance portion 111 outputs an output signal M2 in response to an external control signal M1 and converts the control signal M1 into a voltage level, which is appropriate for internal circuitry of the semiconductor device, and outputs the voltage. The mode entrance portion 111 can input a plurality of control signals. In such a case, the mode entrance portion 111 combines the plurality of control signals and outputs an output signal M2.

The mode entrance control portion 121 generates a mode entrance enable signal MDEN for controlling the semiconductor device to enter a specific mode. The mode entrance control portion 121 will be described in detail with reference to FIG. 2.

The logic portion 131 logically combines the output signal M2 of the mode entrance portion 111 and the mode entrance enable signal MDEN to generate a mode signal MD for setting the specific mode, for example a test mode, of the semiconductor device. The logic portion 131 may comprise an AND gate for performing an AND operation. In this case, the logic portion 131 activates the mode signal MD only if both the output signal M2 and the mode entrance enable signal MDEN are activated, and deactivates the mode signal MD if either of the output signal M2 and the mode entrance enable signal MDEN is deactivated. When the mode signal MD is activated, the semiconductor device enters a test mode. In other words, the semiconductor device is in a proper mode to be tested by electronic test equipment. When the mode signal MD is deactivated, the semiconductor device does not perform a test mode operation but a normal operation. The logic portion 131 may comprise another logic circuit or a combination of a plurality of logic circuits, depending on the application.

Figure 2:
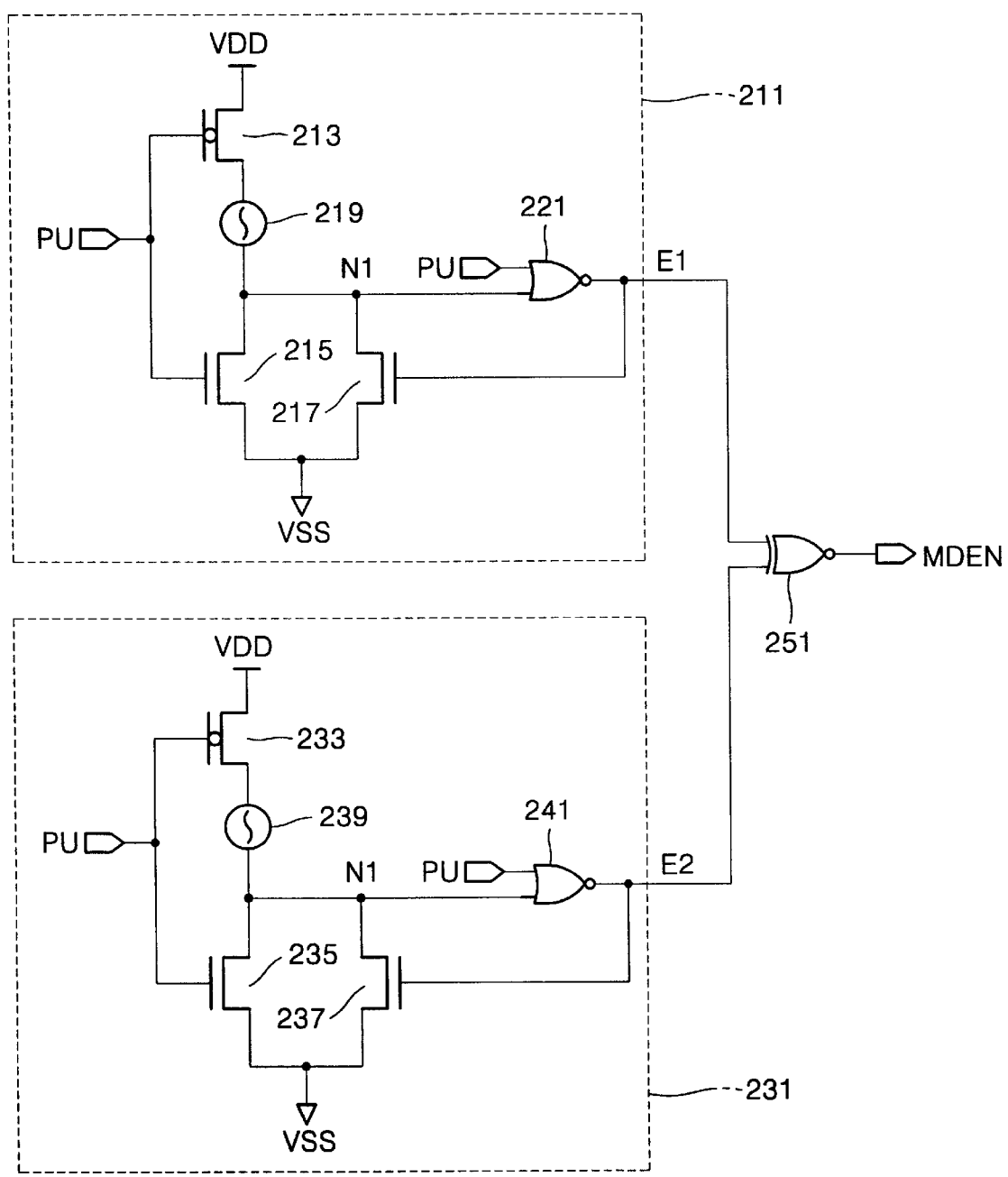
FIG. 2 is a circuit diagram illustrating a preferred embodiment of the mode entering control portion of the present invention shown in FIG. 1.

FIG. 2 is a circuit diagram illustrating a preferred embodiment of the mode entrance control portion 121 of the present invention shown in FIG. 1. Referring to FIG. 2, the mode entrance control portion 121 includes a first fusing portion 211, a second fusing portion 231, and a mode entrance control signal generating portion 251.

The first fusing portion 211 includes, in one embodiment, a first PMOS transistor 213, NMOS transistors 215 and 217, a first fuse 219, and a first NOR gate 221. The first fusing portion 211 outputs a signal E1 in response to a power-up signal PU, which will be described below.

Figure 3:
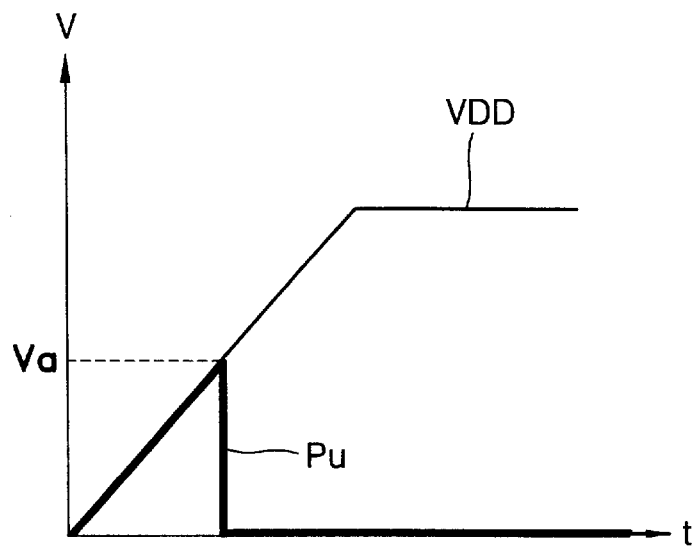
FIG. 3 is a waveform diagram of a power-up signal of FIG. 2.

The waveform of the power-up signal PU is shown in FIG. 3. Referring to FIG. 3, if the supply voltage VDD is applied to the semiconductor device, the voltage of the semiconductor device is gradually increased and reaches a predetermined voltage Va, for example, 1.5V. Then, the power-up signal PU increases when the supply voltage VDD increases. The power-up signal PU exceeds the predetermined voltage Va, and then, the power-up signal PU decreases to 0V.

The operation of the first fusing portion 211 is now described as follows.

First, in a case where the first fuse 219 is in a closed, or connected, state, when the power-up signal PU is applied to the PMOS transistor 213 and the NMOS transistor 215, the PMOS transistor 213 is turned on, and node N1 is increased to the supply voltage level VDD. Then, the NOR gate 221 outputs a signal E1 as logic low. The power-up signal is still logic low, and thus the signal E1 is maintained at logic low level.

Next, in a case where the first fuse 219 is in an open, or disconnected, state, when the power-up signal PU is applied to the PMOS transistor 213 and the NMOS transistor 215 and reaches the predetermined voltage (Va of FIG. 3), the NMOS transistor is turned on. Then, the voltage of the node N1 is decreased to the level of the ground voltage VSS, and the NOR gate 221 outputs the signal E1 as logic high. If the signal E1 is logic high, the NMOS transistor 217 is turned on. Here, the NMOS transistor 217 and the NOR gate 221 comprise a latch circuit, and the node N1 is maintained at the level of the ground voltage VSS. Thus, the signal E1 is maintained at the logic high level.

The second fusing portion 231 outputs a signal E2 in response to the power-up signal PU and includes a second PMOS transistor 233, NMOS transistors 235 and 237, a second fuse 239, and a second NOR gate 241. The structure and operation of the second fusing portion 231 are the same as those of the first fusing portion 211, and thus a description thereof will be omitted.

The mode entrance control signal generating portion 251 receives the signals E1 and E2 and logically combines the signals E1 and E2 to output the mode entrance enable signal MDEN. The mode entrance control signal generating portion 251 may comprise, for example, an exclusive NOR gate. Here, the mode entrance control signal generating portion 251 performs an exclusive NOR operation of the signals E1 and E2 and outputs the mode entrance enable signal MDEN. The mode entrance enable signal MDEN is output as logic high when the signals E1 and E2 are both activated or deactivated, and the MDEN is output as logic low when only one of the signals E1 and E2 is activated. In the case where the mode entrance control signal generating portion 251 is the exclusive NOR gate, input/output values of the mode entrance control signal generating portion 251 are shown in Table 1. Here, logic low is represented as '0', and logic high is represented as '1'.

TABLE 1

| E1 | E2 | MDEN |
| --- | --- | --- |
| 0 | 0 | 1 |
| 0 | 1 | 0 |
| 1 | 0 | 0 |
| 1 | 1 | 1 |

Likewise, if the first and second fuses 219 and 239 are in an initial state, for example, a connected state, a semiconductor producer (or worker) allows the semiconductor device to enter a test mode and tests the semiconductor device. Upon completion of the test, the producer can change the state of one of the first and second fuses 219 and 239 from its initial state. That is, the user can allows one of the first and second fuses 219 and 239 to short-circuit, and therefore open. With one of the two circuits 219, 239 open, and the other closed, the semiconductor device can never enter the test mode during use by an end user, since the mode entrance enable signal MDEN would remain in a low state. Thus, errors that are caused by entry into test mode would therefore not occur in a system in which the semiconductor device of the present invention is mounted.

However, under certain circumstances, for example, in a case where a claim for the semiconductor device is requested, if the fuse 219, 239 that was formerly in a closed state is then opened such that both of the first and second fuses 219 and 239 are disconnected, the semiconductor device can again enter the test mode. As a result, the functionality of the semiconductor device can again be determined via the test process.

The internal structure of the first and second fusing portions 211 and 231 may constitute any of a number of configurations including the first and second fuses 219 and 239. For example, the first and second fusing portions 211 and 231 output the signals E1 and E2 as logic low when both the first and second fuses 219 and 239 are disconnected, and the first and second fusing portions 211 and 231 output the signals E1 and E2 as logic high when the both first and second fuses 219 and 239 are connected. In this case, the mode entrance enable signal MDEN is activated when only one of the first and second fuses 219 and 239 is connected, and the MDEN is deactivated when the first and second fuses 219 and 239 are connected or disconnected.

The state of the first and second fuses 219 and 239 can be changed even following packaging of the semiconductor device. For example, in a case where the first and second fuses 219 and 239 are formed of electrical fuses, the first and second fuses 219 and 239 can be disconnected through the application of external power to the packaged semiconductor device. The first and second fuses 219 and 239 can optionally be formed of laser fuses. In this case, the first and second fuses 219 and 239 can be disconnected by application of laser irradiation to the first and the second fuses 219 and 239.

Figure 4:
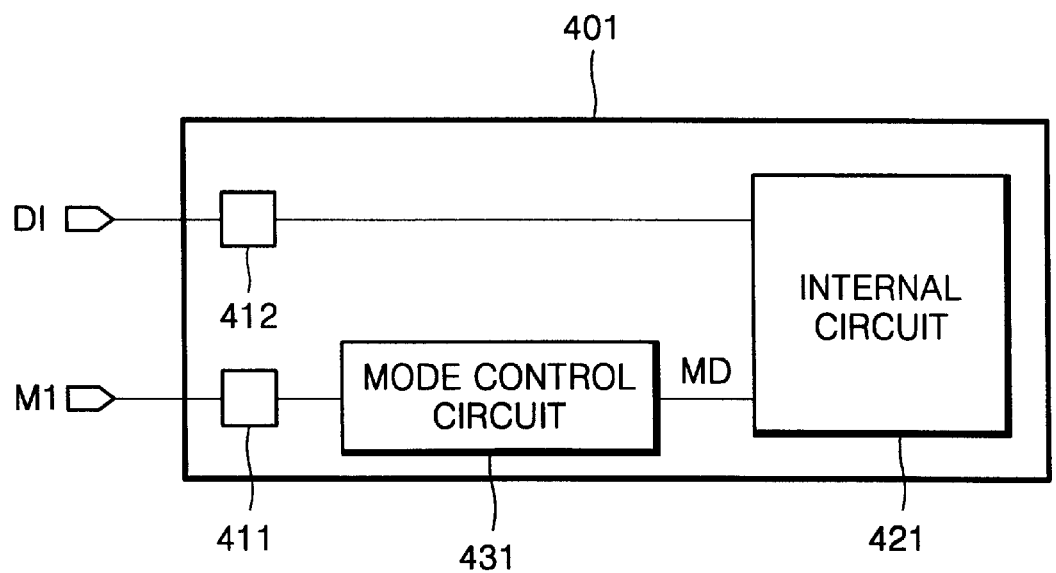
FIG. 4 is a schematic block diagram of a semiconductor memory device having the mode control signal of FIG. 1.

FIG. 4 is a schematic block diagram of a semiconductor memory device having the mode control signal of FIG. 1. Referring to FIG. 4, a semiconductor memory device 401 includes first and second pads 411 and 412, a mode control circuit 431, and an internal circuit 421.

An external control signal M1 and data D1 are input to the first and second pads 411 and 412.

The mode control circuit 431 outputs a mode signal MD for deciding a specific mode, for example, a test mode, of the semiconductor memory device 401 in response to the control signal M1 input through the first pad 411. The structure and operation of the mode control circuit 431 are the same as those of the mode control circuit 101 of FIG. 1. Thus, a description thereof will be omitted.

The internal circuit 421 processes the data D1 input through the second pad 412 according to the mode signal MD. That is, the internal circuit 421 operates in the test mode when the mode signal MD is activated and operates normally when the mode signal MD is deactivated.

The control signal M1 and the data D1 of the present invention may be the same signals. In this case, the first pad 411 is part of the second pad 412.

The semiconductor memory device 401 includes the mode control circuit 431, thereby preventing the semiconductor memory device 401 from entering the test mode during end use of the semiconductor memory device 401. As a result, errors caused by the semiconductor memory device 401 improperly entering the test mode do not occur in a system in which the semiconductor memory device 401 is installed.

As described above, upon completion of an initial test procedure, the state of one of the first and second fuses 219 and 239 of the semiconductor memory device 401 is changed, thereby preventing the semiconductor device or the semiconductor memory device 401 from entering the specific mode during end use. Thus, the occurrence of errors caused by the semiconductor device or the semiconductor memory device 401 entering the specific mode in a system in which the semiconductor device or the semiconductor memory device 401 is mounted can be prevented. Also, if testing of the semiconductor device is later desired, for example, even during end use of the semiconductor device or the semiconductor memory device 401, the state of the other one of the first and second fuses 219 and 239 can be changed, thereby allowing entry into test mode.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A mode control circuit for a semiconductor device, the mode control circuit comprising:
   a mode entrance portion for outputting an output signal in response to an external control signal;
   a mode entrance control portion for generating a mode entrance enable signal for controlling entry of a specific mode of operation by the semiconductor device, wherein the specific mode is a test mode for testing electrical functions of the semiconductor device and
   a logic portion for logically combining the output signal of the mod entrance portion and the mode entrance enable signal to generate a mode signal for setting the specific mode;
   wherein the mode entrance control portion comprises:
      a first fusing portion including a first fuse;
      a second fusing portion including a second fuse; and
      a mode entrance control signal generating portion for activating the mode entrance enable signal in a first case where the first and second fuses are maintained at an initial state or are changed from the initial state, and deactivating the mode entrance enable signal in a second case where only one of the first and second fuses is changed from the initial state.

2. The mode control circuit as claimed in claim 1, wherein the initial state of the first and second fuses is a state where the first and second fuses are closed.

3. The mode control circuit as claimed in claim 1, wherein the state where the first and second fuses are changed at the initial state is a state where the first and second fuses are open.

4. The mode control circuit as claimed in claim 1, wherein at least one of the first and second fuses can be changed from the initial state following packaging of the semiconductor device.

5. The mode control circuit as claimed in claim 4, wherein the first and second fuses can be opened by application of external power in the packaged semiconductor device.

6. The mode control circuit as claimed in claim 1, wherein the first and second fusing portions are operated in response to a power-up signal which is increased to a predetermined voltage and is decreased to a null voltage, respectively, when supply voltage is applied to the semiconductor device.

7. A semiconductor memory device comprising:
   first and second pads for inputting an external control signal and data;
   a mode control circuit for outputting a mode signal that indicates a specific mode of the semiconductor memory device in response to the control signal input through the first pad; and
   an internal circuit for processing data input at the second pad in response to the mode signal;

wherein the mode control circuit comprises:

a mode entrance portion for outputting an output signal in response to the control signal;

a mode entrance control portion for having a first fusing portion including a first fuse, a second fusing portion including a second fuse, and a mode e trance control signal generating portion for activating a mode entrance enable signal in a first case where the first and second fuses are maintained at an initial state or are changed from the initial state, and deactivating the mode entrance enable signal in a second case where only one of the first and second fuses is changed from the initial state, to generate the mode entrance enable signal for controlling entry of a specific mode of operation by the semiconductor device, wherein the specific mode is a test mode for testing the electrical functions of the semiconductor device; and a logic portion for logically combining the output signal of the mode entrance portion and the mode entrance enable signal to generate the mode signal for setting the specific mode.

8. The semiconductor memory device as claimed in claim 7, wherein the internal circuit operates in the specific mode when the mode signal is activated and operates in a mode other than the specific mode when the mode signal is deactivated.

9. A mode control circuit for a semiconductor device, the mode control circuit comprising:

a mode entrance portion for outputting an output signal in response to an external control signal;

a mode entrance control portion for generating a mode entrance enable signal for controlling entry of a specific mode of operation by the semiconductor device; and a logic portion for logically combining the output signal of the mode entrance portion and the mode entrance enable signal to generate a mode signal for setting the specific mode;

wherein the mode entrance control portion comprises:
a first fusing portion including a first fuse;
a second fusing portion including a second fuse; and
a mode entrance control signal generating portion for activating the mode entrance enable signal in a first case where the first and second fuses are maintained at an initial state or are changed from the initial state, and deactivating the mode entrance enable signal in a second case where only one of the first and second fuses is changed from the initial state;

wherein the first and second fusing portions are operated in response to a power-up signal which is increased to a predetermined voltage and is decreased to a null voltage, respectively, when supply voltage is applied to the semiconductor device.

10. The mode control circuit as claimed in claim 9, wherein the initial state of the first and second fuses is a state where the first and second fuses are closed.

11. The mode control circuit as claimed in claim 9, wherein the state where the first and second fuses are changed at the initial state is a state where the first and second fuses are open.

12. The mode control circuit as claimed in claim 9, wherein at least one of the first and second fuses can be changed from the initial state following packaging of the semiconductor device.

13. The mode control circuit as claimed in claim 12, wherein the first and second fuses can be opened by application of external power in the packaged semiconductor device.

14. The mode control circuit as claimed in claim 9, wherein the specific mode is a test mode for testing the electrical functions of the semiconductor device.

* * * * *

UNITED STATES PATENT AND TRADEMARK OFFICE
CERTIFICATE OF CORRECTION

PATENT NO.    : 6,667,916 B2  
DATED         : December 23, 2003  
INVENTOR(S)   : Kye-hyun Kyung It is certified that error appears in the above-identified patent and that said Letters Patent is hereby corrected as shown below:

<u>Column 6,</u>
Line 26, delete "mod" and insert -- mode --.

<u>Column 7,</u>
Line 6, delete "e trance" and insert -- entrance --.

Signed and Sealed this

Ninth Day of March, 2004

JON W. DUDAS
*Acting Director of the United States Patent and Trademark Office*